(12) United States Patent
Takenouchi et al.

(10) Patent No.: US 10,896,822 B2
(45) Date of Patent: Jan. 19, 2021

(54) GRINDING APPARATUS

(71) Applicant: DISCO CORPORATION, Tokyo (JP)

(72) Inventors: Kenji Takenouchi, Tokyo (JP);
Takayuki Gawazawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 359 days.

(21) Appl. No.: 16/059,661

(22) Filed: Aug. 9, 2018

(65) Prior Publication Data

US 2019/0067018 A1    Feb. 28, 2019

(30) Foreign Application Priority Data

Aug. 22, 2017  (JP) .................. 2017-159238

(51) Int. Cl.
| | | |
|---|---|---|
| *H01L 21/304* | (2006.01) | |
| *B24B 5/04* | (2006.01) | |
| *B24B 7/22* | (2006.01) | |
| *B24B 5/307* | (2006.01) | |
| *B24B 55/02* | (2006.01) | |
| *H01L 21/02* | (2006.01) | |

(52) U.S. Cl.
CPC ............ *H01L 21/304* (2013.01); *B24B 5/045* (2013.01); *B24B 5/307* (2013.01); *B24B 7/228* (2013.01); *B24B 55/02* (2013.01); *H01L 21/02013* (2013.01)

(58) Field of Classification Search
CPC ............ H01L 21/304; H01L 21/02013; H01L 21/30625; B24B 5/045; B24B 5/307; B24B 7/228; B24B 55/02; B24D 3/06; B24D 3/14; B24D 3/10

USPC .................................................... 451/64, 54
See application file for complete search history.

(56) References Cited

U.S. PATENT DOCUMENTS

2009/0098808 A1 *  4/2009  Kajiyama ................ B24B 1/00
                                                             451/41
2016/0218023 A1 *  7/2016  Takenouchi ...... H01L 21/67092

FOREIGN PATENT DOCUMENTS

JP          2001284303 A       10/2001

* cited by examiner

*Primary Examiner* — Joseph J Hail
*Assistant Examiner* — Jonathan R Zaworski
(74) *Attorney, Agent, or Firm* — Greer Burns & Crain Ltd.

(57) ABSTRACT

A grinding apparatus includes a table that holds a workpiece, and a grinding unit including a grinding wheel mounted to a spindle. The grinding wheel has a grindstone formed by binding abrasive grains with a bonding agent. In addition, the grinding apparatus further includes: a grinding water supply unit that supplies grinding water to at least the grindstone; a light applying unit that is disposed adjacent to the table and that applies light to a grinding surface of the grindstone grinding the workpiece held by the table; and a light applying unit moving section by which the light applying unit can be positioned at a first position on a rotational trajectory of the grinding wheel in the case where the grinding wheel has a first diameter and a second position on a rotational trajectory of the grinding wheel in the case where the grinding wheel has a second diameter.

4 Claims, 7 Drawing Sheets

GRINDING APPARATUS

BACKGROUND OF THE INVENTION

Field of the Invention

The present invention relates to a grinding apparatus including a holding table that holds a workpiece, and a grinding unit (grinding means) having a grinding wheel for grinding the workpiece held by the holding table.

Description of the Related Art

A plate-shaped workpiece such as a semiconductor wafer is ground by a grinding apparatus (see, for example, Japanese Patent Laid-open No. 2001-284303) to be thinned to a predetermined thickness, and is thereafter divided by a cutting apparatus or the like into individual device chips, which are utilized for various electronic apparatuses and the like.

SUMMARY OF THE INVENTION

In the case where the wafer is formed of a difficultly grindable material such as gallium nitride (GaN), silicon carbide (SiC) or gallium arsenide (GaAs), there is a problem that the wearing amount of a grindstone of a grinding wheel is large and production cost is raised thereby. In addition, in the case of grinding a wafer formed of a metal or a wafer in which metallic electrodes are partly exposed at a surface to be ground of the wafer, there is a problem that ductility of the metal makes it difficult to perform grinding.

It is therefore an object of the present invention to restrain excessive wear of a grindstone and to enable smooth grinding, in the case of grinding a wafer formed of a difficultly grindable material or a wafer including a metal.

In accordance with an aspect of the present invention, there is provided a grinding apparatus including a holding table that holds a workpiece, and a grinding unit including a spindle and a grinding wheel that is mounted to the spindle and that grinds the workpiece held by the holding table. The grinding wheel has a grindstone formed by binding abrasive grains with a bonding agent. The grinding apparatus further includes: a grinding water supply unit that supplies grinding water to at least the grindstone when the workpiece held by the holding table is ground by the grinding unit; a light applying unit that is disposed adjacent to the holding table and that applies light to a grinding surface of the grindstone grinding the workpiece held by the holding table; and a light applying unit moving section by which the light applying unit can be positioned at a first position on a rotational trajectory of the grinding wheel mounted on the spindle in the case where the grinding wheel has a first diameter and a second position on a rotational trajectory of the grinding wheel in the case where the grinding wheel has a second diameter.

Preferably, the grindstone has the abrasive grains and photocatalyst grains bound by the bonding agent, and the light applying unit applies the light that excites the photocatalyst grains.

In addition, the bonding agent is preferably a vitrified bond.

In the grinding apparatus according to the present invention, the grinding wheel has the grindstone formed by binding abrasive grains with the bonding agent, and the grinding apparatus includes: the grinding water supply unit that supplies grinding water to at least the grindstone when the workpiece held by the holding table is ground by the grinding unit; the light applying unit that is disposed adjacent to the holding table and that applies light to the grinding surface of the grindstone grinding the workpiece held by the holding table; and the light applying unit moving section by which the light applying unit can be positioned at the first position on the rotational trajectory of the grinding wheel mounted to the spindle in the case where the grinding wheel has the first diameter and the second position on the rotational trajectory of the grinding wheel in the case where the grinding wheel has the second diameter. Therefore, it is possible to position the light applying unit at an appropriate position according to the diameter of the grinding wheel possessed by the grinding unit, to efficiently make hydrophilic or the like the grindstone cutting into the workpiece, thereby to enhance a cooling effect of grinding water, to restrain wearing of the grindstone, and to enhance a swarf discharging property. Further, with the grindstone made hydrophilic or the like, grinding water is effectively supplied into the processing region where the grindstone grinds the workpiece, and, therefore, processing quality can be prevented from being lowered due to processing heat, and smooth grinding can be achieved even in the case where the workpiece is a wafer formed of a difficultly grindable material.

In addition, where the grindstone is formed by binding the abrasive grains and the photocatalyst grains with the bonding agent and the light applying unit applies light that excites the photocatalyst grains, it is ensured that the grinding water supplied exhibits an oxidizing power due to hydroxyl radicals. Therefore, even if the workpiece is a wafer formed, for example, of a difficultly grindable material, it is possible to oxidize the surface to be ground of the workpiece by the strong oxidizing power of the thus produced hydroxyl radicals, to perform grinding while embrittling the surface through the oxidation, and to smoothly grind the workpiece. Similarly, even when the workpiece is a wafer formed of a metal or a wafer in which metallic electrodes are partly exposed at the surface to be ground of the wafer, grinding can be performed while embrittling the metal through oxidation by the strong oxidizing power of hydroxyl radicals, and, therefore, the workpiece can be ground smoothly.

With the vitrified bond used as the bonding agent in the grindstone, the property of making hydrophilic or the like the grinding surface of the grindstone by application of light thereto can be enhanced more.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
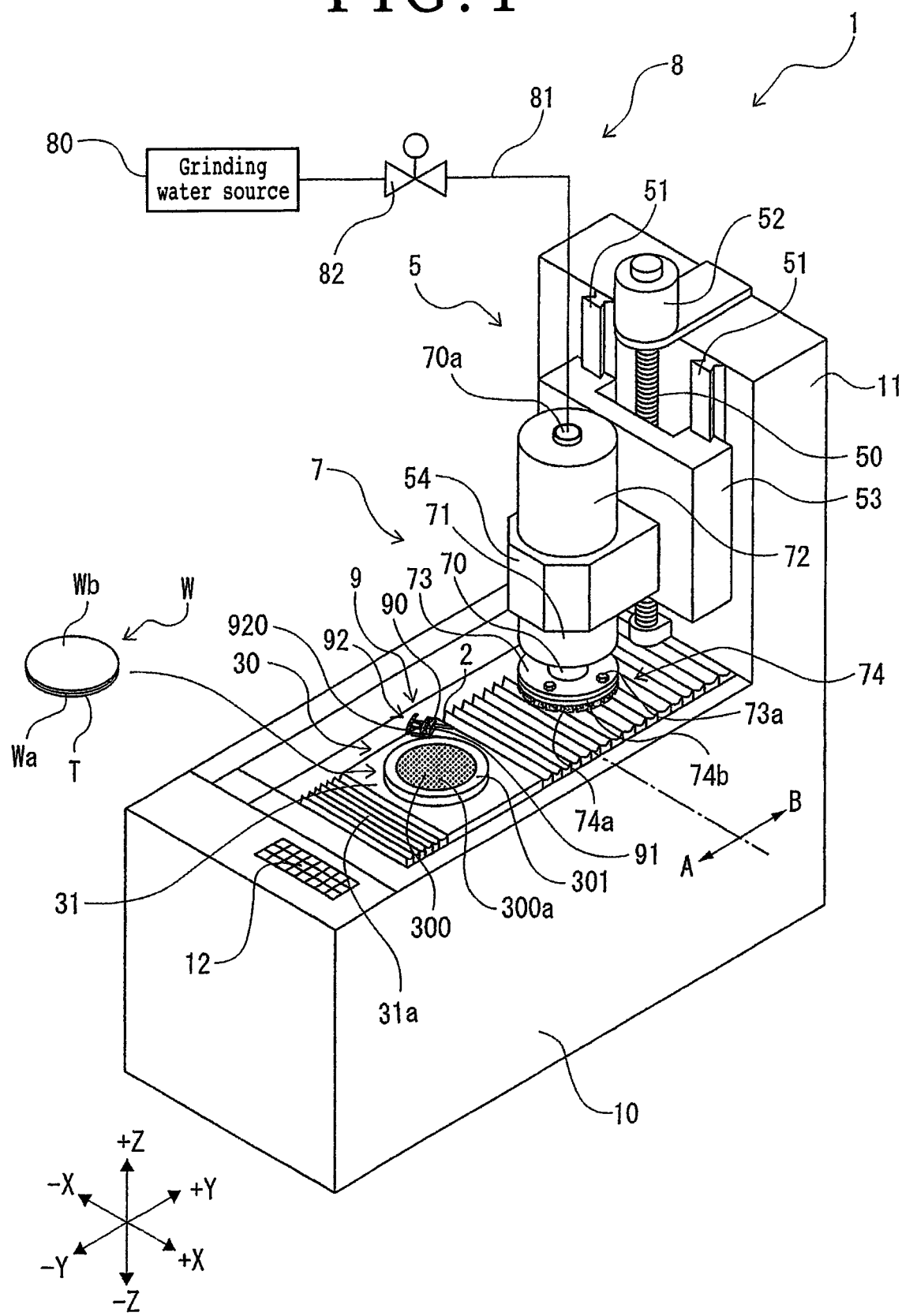
FIG. 1 is a perspective view depicting an example of a grinding apparatus.

A grinding apparatus 1 depicted in FIG. 1 is an apparatus that grinds a workpiece W held on a holding table 30 by a grinding unit (grinding means) 7 provided with a grinding wheel 74. A front side (−Y direction side) on a base 10 of the grinding apparatus 1 is a mounting/detaching region A in which the workpiece W is mounted onto and detached from the holding table 30, and a rear side on the base 10 is a grinding region B in which grinding of the workpiece W is conducted by the grinding unit 7. Input means 12 through which an operator inputs processing conditions and the like to the grinding apparatus 1 is disposed on the front side on the base 10.

The holding table 30 is, for example, circular in outer shape, and includes a suction holding section 300 that holds the workpiece W by suction, and a frame body 301 that supports the suction holding section 300. The suction holding section 300 communicates with a suction source (not depicted), and the workpiece W is suction held on a holding surface 300a which is an exposed surface of the suction holding section 300. The holding surface 300a of the holding table 30 is formed in the shape of a conical surface having an extremely gentle inclination with a rotational center of the holding table 30 as a peak. The holding table 30 is surrounded by a cover 31 from the surroundings, is rotatable about an axis set in the vertical direction, and can be reciprocated in a Y-axis direction between the mounting/detaching region A and the grinding region B by Y-axis direction feeding means (not depicted) disposed on the lower side of the cover 31 and a bellows cover 31a connected to the cover 31. The holding table 30 is, for example, an 8-inch holding table for use in the case of grinding a workpiece W having a diameter of 8 inches. In the case of grinding a workpiece W having a diameter of 6 inches (see FIG. 7A), the grinding apparatus 1 has the 8-inch holding table 30 replaced by a 6-inch holding table 30a (see FIG. 7A), whereby appropriate grinding can be applied to workpieces of different wafer sizes.

A column 11 is erectly provided in the grinding region B, and grinding feeding means 5 for putting the grinding unit 7 into grinding feeding in a Z-axis direction is disposed on a lateral side of the column 11. The grinding feeding means 5 includes a ball screw 50 having an axis in the Z-axis direction, a pair of guide rails 51 disposed in parallel to the ball screw 50, a motor 52 that is connected to an upper end of the ball screw 50 and rotates the ball screw 50, a lift plate 53 a nut in the inside of which is in screw engagement with the ball screw 50 and side portions of which make sliding contact with the guide rails 51, and a holder 54 that is connected to the lift plate 53 and holds the grinding unit 7. When the motor 52 rotates the ball screw 50, the lift plate 53 is reciprocated in the Z-axis direction while guided by the guide rails 51 attendant on this, and the grinding unit 7 held by the holder 54 is put into grinding feeding in the Z-axis direction.

The grinding unit 7 includes a spindle 70 having an axial direction in the Z-axis direction, a housing 71 that supports the spindle 70 in a rotatable manner, a motor 72 that rotationally drives the spindle 70, a mount 73 connected to a tip of the spindle 70, and a grinding wheel 74 detachably mounted to a lower surface of the mount 73.

Figure 2:
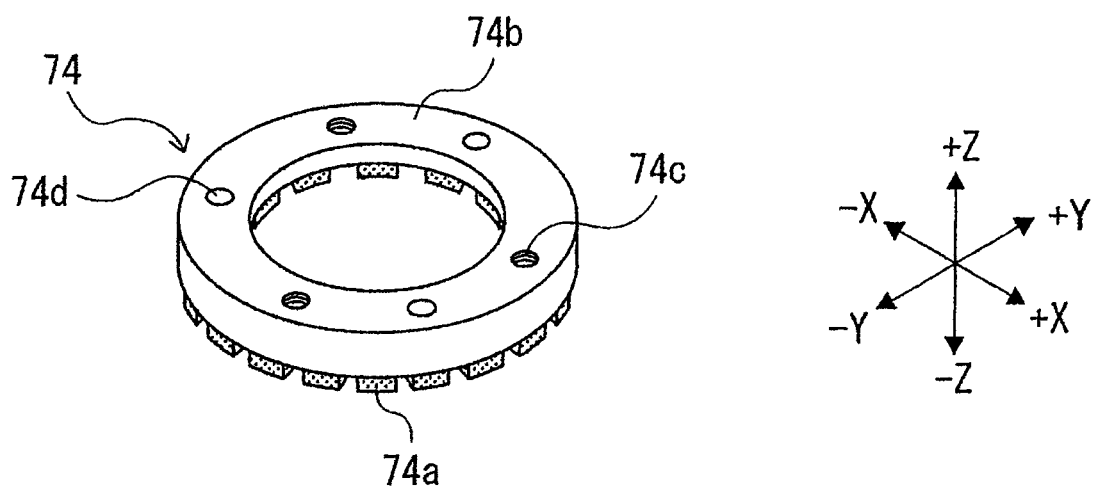
FIG. 2 is a perspective view depicting an example of a grinding wheel.
Figure 3:
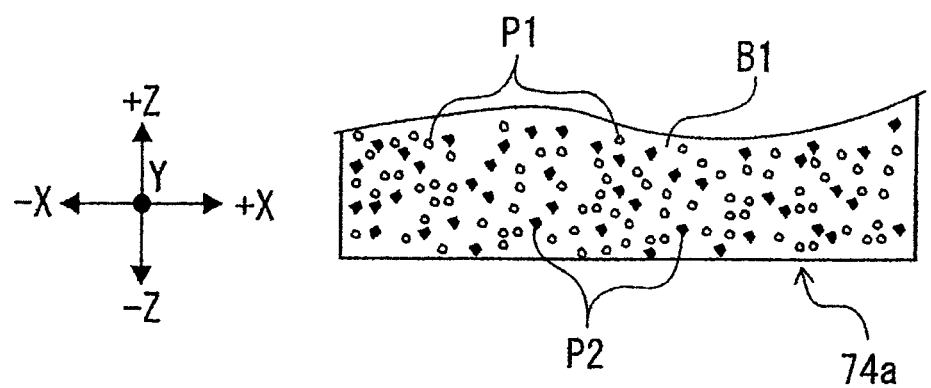
FIG. 3 is a front view depicting, in an enlarged form, part of a grindstone.

The grinding wheel 74 depicted in FIG. 2 includes an annular wheel base 74b, and a plurality of substantially rectangular parallelepiped grindstones 74a arranged in an annular pattern on a bottom surface (free end portion) of the wheel base 74b. An upper surface of the wheel base 74b is provided with tapped holes 74c, and jet ports 74d through which grinding water is jetted toward the grindstones 74a. As depicted in FIG. 3, the grindstone 74a in the present embodiment is formed by mixing diamond abrasive grains P1 with photocatalyst grains P2 such as titanium oxide ($TiO_2$) grains, and binding the mixture by a vitrified bond B1, which is a vitrified or ceramic bonding agent. The grinding wheel 74 is mounted to a lower surface of the mount 73 by putting screws 73a depicted in FIG. 1 into screw engagement with the tapped holes 74c in the wheel base 74b through holes provided in the mount 73.

The shape of the grindstone 74a may be an integral annular shape, and the photocatalyst grains P2 may be tin oxide grains, zinc oxide grains, cerium oxide grains or the like. Note that the grindstone 74a may not contain the photocatalyst grains P2, and a bonding agent other than the vitrified bond may be used as the bonding agent therein.

The grinding wheel 74 is, for example, a grinding wheel of 8 inches in diameter which is used in the case of grinding a workpiece W of 8 inches in diameter. In the case of grinding a workpiece W1 of 6 inches in diameter, by the grinding apparatus 1, the grinding wheel 74 of 8 inches in diameter is replaced by the grinding wheel of 6 inches in diameter, whereby appropriate grinding can be applied to workpieces of different sizes.

A method of manufacturing the grinding wheel 74 is as follows. First, the vitrified bond B1 is mixed with diamond abrasive grains P1 of #1000 in grain size, and the resultant mixture is further mixed with the photocatalyst grains P2, followed by stirring. As the vitrified bond B1, for example, silicon dioxide ($SiO_2$) is used as a main constituent, which may be admixed with a trace amount of additive for controlling the melting point. Next, this mixture is heated at a predetermined temperature, followed further by pressing to mold the mixture into a substantially rectangular parallelepiped shape. Thereafter, sintering is further conducted at a high temperature for several hours, to produce a grindstone 74a. The content of the photocatalyst grains P2 in the grindstone 74a is 15 wt %, for example. A plurality of the grindstones 74a thus produced are arranged in an annular pattern and fixed to a bottom surface of the wheel base 74b, to manufacture the grinding wheel 74. Note that the grain size of the diamond abrasive grains P1 is not limited to the example in the present embodiment, and may be appropriately modified according to the kind and content of the photocatalyst grains P2 and the like factors.

In the inside of the spindle 70 depicted in FIG. 1, a channel 70a which communicates with a grinding water supply unit (grinding water supply means) 8 for supplying grinding water to the grindstones 74a and which serves as a passage of the grinding water is provided penetrating in the axial direction (Z-axis direction) of the spindle 70, such that the grinding water having passed through the channel 70a can pass through the mount 73 and be jetted from the wheel base 74b toward the grindstones 74a.

The grinding water supply unit 8 includes a grinding water source 80 reserving water (for example, pure water), a piping 81 connected to the grinding water source 80 and communicating with the channel 70a, and a control valve 82 disposed at an arbitrary position on the piping 81 for controlling the quantity of the grinding water supplied, and supplies the grinding water to the grindstones 74a at least.

Figure 4:
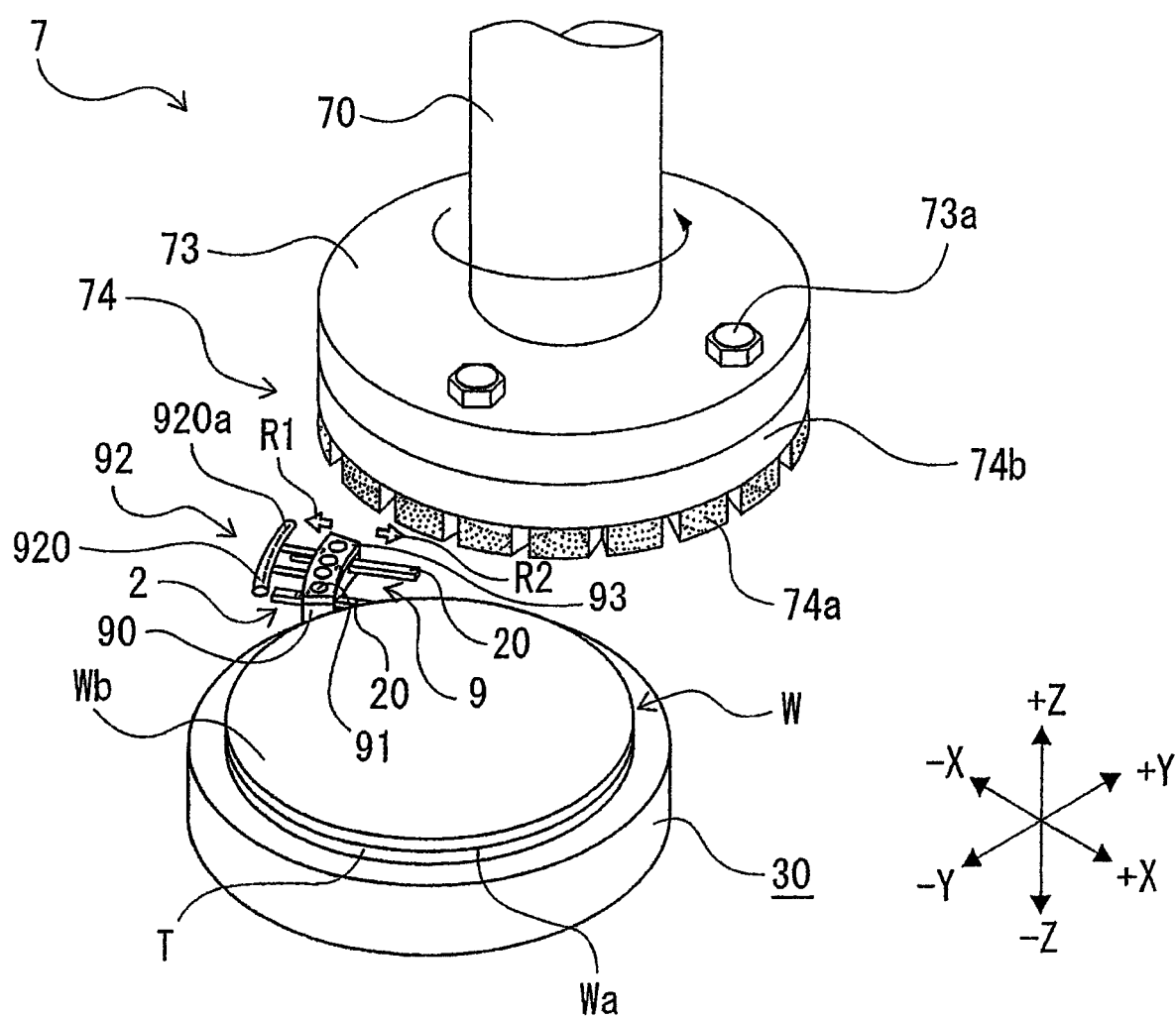
FIG. 4 is a perspective view depicting an example of positional relation of a grinding unit, a holding table and a light applying unit.

As illustrated in FIGS. 1 and 4, the grinding apparatus 1 includes a light applying unit (light applying means) 9 that is disposed adjacent to the holding table 30 and that applies light to grinding surfaces (lower surfaces) of the grindstones 74a grinding the workpiece W held by the holding table 30. As depicted in FIG. 4, the light applying unit 9 includes, for example, a base section 90 having a substantially arcuate outer shape, a plurality of (in the example illustrated, four) light emission sections 91 alignedly disposed on an upper surface of the base section 90, a cleaning water supply section 92 that supplies cleaning water (for example, pure water) toward the light emission sections 91, and a cover 93 that prevents dirt from adhering to the light emission sections 91.

For example, the light emission sections 91 embedded in dents formed in the upper surface of the base section 90 are of light emitting diode (LED) illumination that can emit light of a predetermined wavelength, and can be switched between an ON state and an OFF state by a power source (not depicted). Note that in the case where the photocatalyst grains P2 contained in the grindstones 74a are titanium oxide grains as in the present embodiment, the wavelength of the light (ultraviolet (UV) light) produced by the light emission sections 91 is, for example, preferably 201 to 400 nm, and more preferably 201 to 365 nm.

Note that in the case where the grindstone 74a does not contain the photocatalyst grains P2, the light emission section 91 is preferably a low pressure mercury lamp or a two-wavelength LED that can emit light at two wavelengths, and is preferably able to emit light of a wavelength of 80 to 200 nm (for example, a wavelength of 185 nm) and light of a wavelength of 240 to 280 nm (for example, a wavelength of 254 nm). It is natural that in the case where the grindstone 74a does not contain the photocatalyst grains P2, light of a wavelength of 201 to 365 nm may be applied thereto.

The plate-shaped cover 93 is composed, for example, of a transparent member such as a glass, and is fixed on the upper surface of the base section 90 in such a manner as to cover the light emission sections 91. For example, the base section 90 is movable in the vertical direction, such that when performing grinding, the height position of an upper surface of the cover 93 can be set to a desired height position taking into account a grinding feeding position of the grindstones 74a.

The cleaning water supply section 92 includes, for example, a cleaning water source (not depicted) in which water is reserved, and a cleaning water nozzle 920 communicating with the cleaning water source. The cleaning water nozzle 920 is, for example, fixed to a side surface of the base section 90 in such a manner as to lie along the base section 90, and a plurality of narrow width slit-formed jet ports 920a for jetting cleaning water toward the cover 93 covering the light emission sections 91 are aligned in the longitudinal direction of the cleaning water nozzle 920. The jet ports 920a has a shape, a size, an angle relative to the light emission section 91, etc. set in such a manner that the flow of the cleaning water jetted can be straightened on the upper surface of the cover 93.

The grinding apparatus 1 is provided with a light applying unit moving section (light applying means moving section) 2 by which the light applying unit 9 can be positioned at a first position on a rotational trajectory E (see FIG. 7A) of the grinding wheel 74 in the case where the grinding wheel 74 has a first diameter (for example, 8 inches) and a second position on a rotational trajectory e (see FIG. 7A) of the grinding wheel in the case where the grinding wheel has a second diameter (for example, 6 inches).

Figure 5:
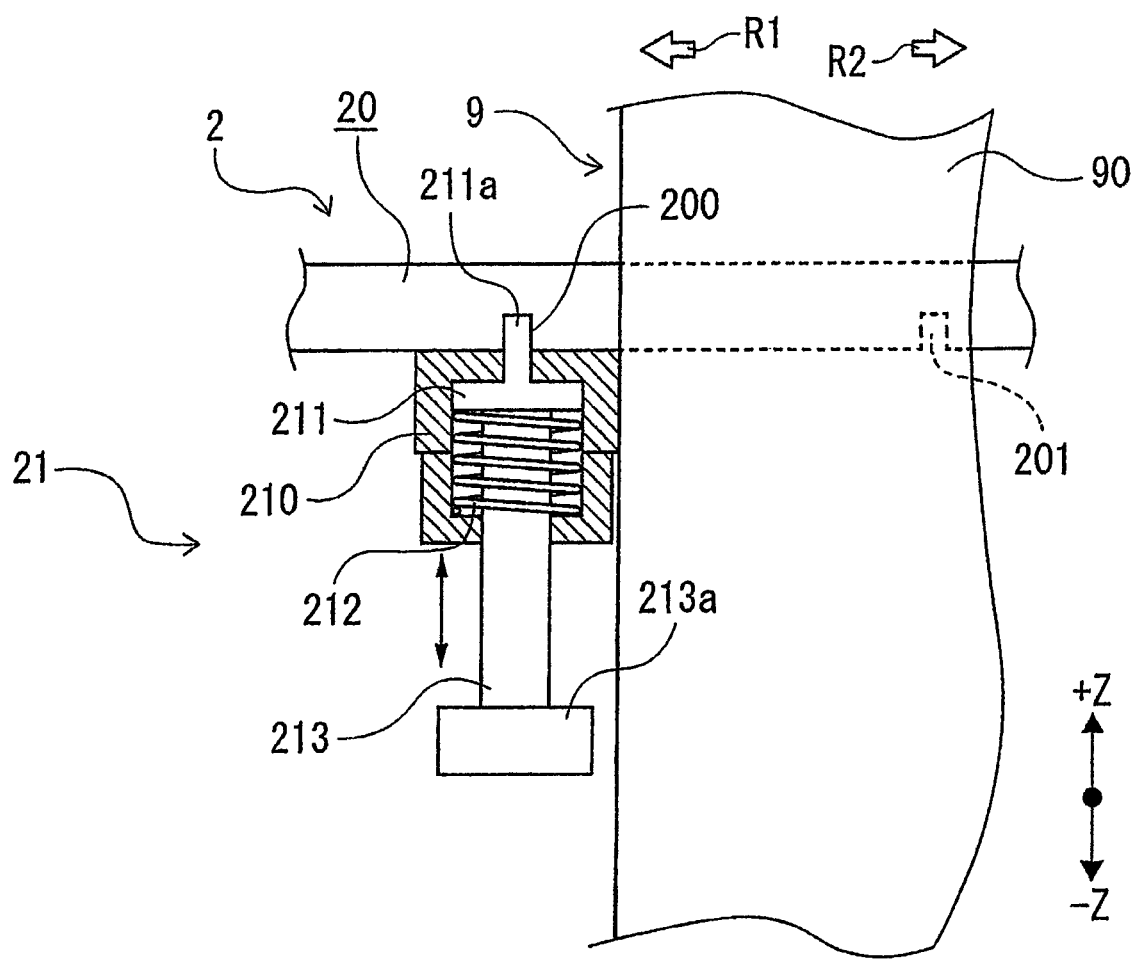
FIG. 5 is a vertical sectional view depicting an example of the structure of a light applying unit moving section.

The light applying unit moving section 2 depicted in FIGS. 4 and 5 includes, for example, a pair of guide rails 20 to which the base section 90 of the light applying unit 9 is fitted in such a manner as to be slidable toward the arrow R1 side or the arrow R2 side, and a position fixing mechanism 21 (not depicted in FIG. 4) that is moved together with the base section 90 and can fix the base section 90 at a predetermined position in the extending direction of the guide rails 20.

The position fixing mechanism 21 depicted in FIG. 5 includes, for example: a casing 210 attached to a side surface of the base section 90 of the light applying unit 9; a movable member 211 that is provided with a projection 211a and is moved in the vertical direction inside the casing 210; a compression coil spring 212 that is disposed inside the casing 210 and that, by shrinking, stores a biasing force for pushing back the movable member 211 upward; and a piston 213 that is inserted on the inner circumference side of the compression coil spring 212, has an upper end fixed to the movable member 211, and is integrally formed with a knob 213a at a lower end thereof.

For example, a lower surface of each of the pair of guide rails 20 is formed with a positioning recessed groove 200 and a positioning recessed groove 201 at a predetermined interval (for example, 2 inches) in the extending direction of the guide rails 20. An upper surface of the casing 210 is formed, in a penetrating manner, with a protrusion hole through which the projection 211a is protruded to the exterior. When the base section 90 is slid along the guide rails 20 and the projection 211a is located beneath either the positioning recessed grooves 200 or the positioning recessed grooves 201, the movable member 211 is pushed upward by the biasing force of the compression coil spring 212, and the projection 211a protruded from the casing 210 is fitted to either the positioning recessed grooves 200 or the positioning recessed grooves 201. Then, the light applying unit 9 is fixed at a predetermined position in the extending direction of the guide rails 20.

An operation of the grinding apparatus 1 depicted in FIG. 1 in the case of grinding the workpiece W by use of the grinding apparatus 1 will now be described below.

The circular disk-shaped workpiece W of 8 inches in diameter depicted in FIG. 1 is, for example, a semiconductor wafer formed of SiC which is difficult to grind, a multiplicity of devices are formed in regions partitioned in a grid pattern by streets (division lines) on a front surface Wa of the workpiece W directed to the lower side in FIG. 1, and a protective tape T for protecting the front surface Wa is adhered thereto. A back surface Wb of the workpiece W is a surface to be ground by the grinding wheel 74. Note that the shape and kind of the workpiece W are not particularly limited, but can be appropriately modified in relation to the grinding wheel 74; examples of the applicable workpiece W include a wafer formed of GaAs, GaN or the like, a wafer formed of a metal, and a wafer in which metallic electrodes are partly exposed to the back surface side of the wafer.

First, in the mounting/detaching region A, the workpiece W is placed on the holding surface 300a of the holding table 30, with its back surface Wb on the upper side. Then, a suction force generated from a suction source (not depicted) is transmitted to the holding surface 300a, whereby the holding table 30 holds the workpiece W on the holding surface 300a by suction. The workpiece W is in the state of being suction held along the holding surface 300a which is a gently inclined conical surface.

The holding table 30 is moved in a +Y direction to a position under the grinding unit 7 by the Y-axis direction feeding means (not depicted), whereby aligning of the grinding wheel 74 and the workpiece W held by the holding table 30 is performed. The aligning is conducted, for example, in such a manner that the rotational center of the grinding wheel 74 is deviated by a predetermined distance in the +Y direction from the rotational center of the workpiece W, and the rotational trajectory of the grindstones 74a passes the rotational center of the workpiece W. In addition, the inclination of the holding table 30 is adjusted such that the holding surface 300a which is a gently inclined conical surface becomes parallel to the grinding surfaces which are lower surfaces of the grindstones 74a, whereby the back surface Wb of the workpiece W is made to be parallel to the grinding surfaces of the grindstones 74a.

Figure 6:
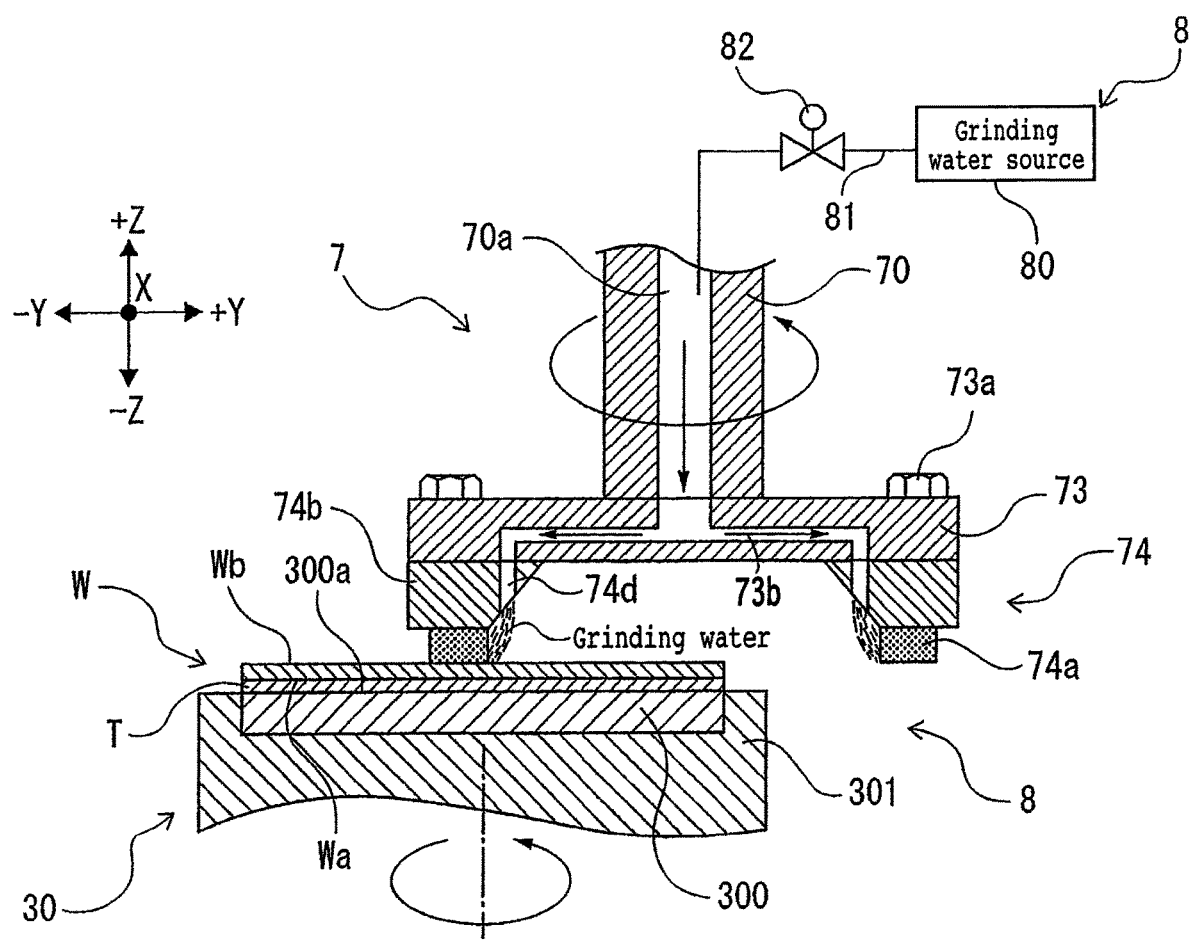
FIG. 6 is an end view depicting a state in which a workpiece held by a holding table is being ground by the grindstone.

After the aligning of the grinding wheel 74 and the workpiece W is performed, the spindle 70 is rotationally driven by the motor 72, and, attendant on this, the grinding wheel 74 is rotated counterclockwise as viewed from the +Z direction side, as depicted in FIG. 6. In addition, the grinding unit 7 is fed in the −Z direction by the grinding feeding means 5, and the grinding wheel 74 is gradually lowered in the −Z direction, and the grindstones 74a come into contact with the back surface Wb of the workpiece W, whereby grinding is performed. Further, during the grinding, the workpiece W is also rotated attendant on the rotation of the holding table 30 in the counterclockwise direction as viewed from the +Z direction side, so that the grindstones 74a perform grinding of the whole area of the back surface Wb of the workpiece W.

During the grinding, the grinding water supply unit 8 supplies grinding water into the channel 70a in the spindle 70. As depicted in FIG. 6, the grinding water supplied into the channel 70a passes through channels 73b formed inside the mount 73 at regular intervals in the circumferential direction of the mount 73, and, further, is jetted through the jet ports 74d of the wheel base 74b toward the grindstones 74a.

Since the workpiece W is suction held on the holding surface 300a, which is a gently inclined conical surface, of the holding table 30 along the holding surface 300a, the grindstones 74a make contact with, and grind, the workpiece W in a region E1 (hereinafter referred to as processing region E1) in the rotational trajectory E of the grinding wheel 74 indicated by alternate long and short dash line in FIG. 7A.

Figure 7A:
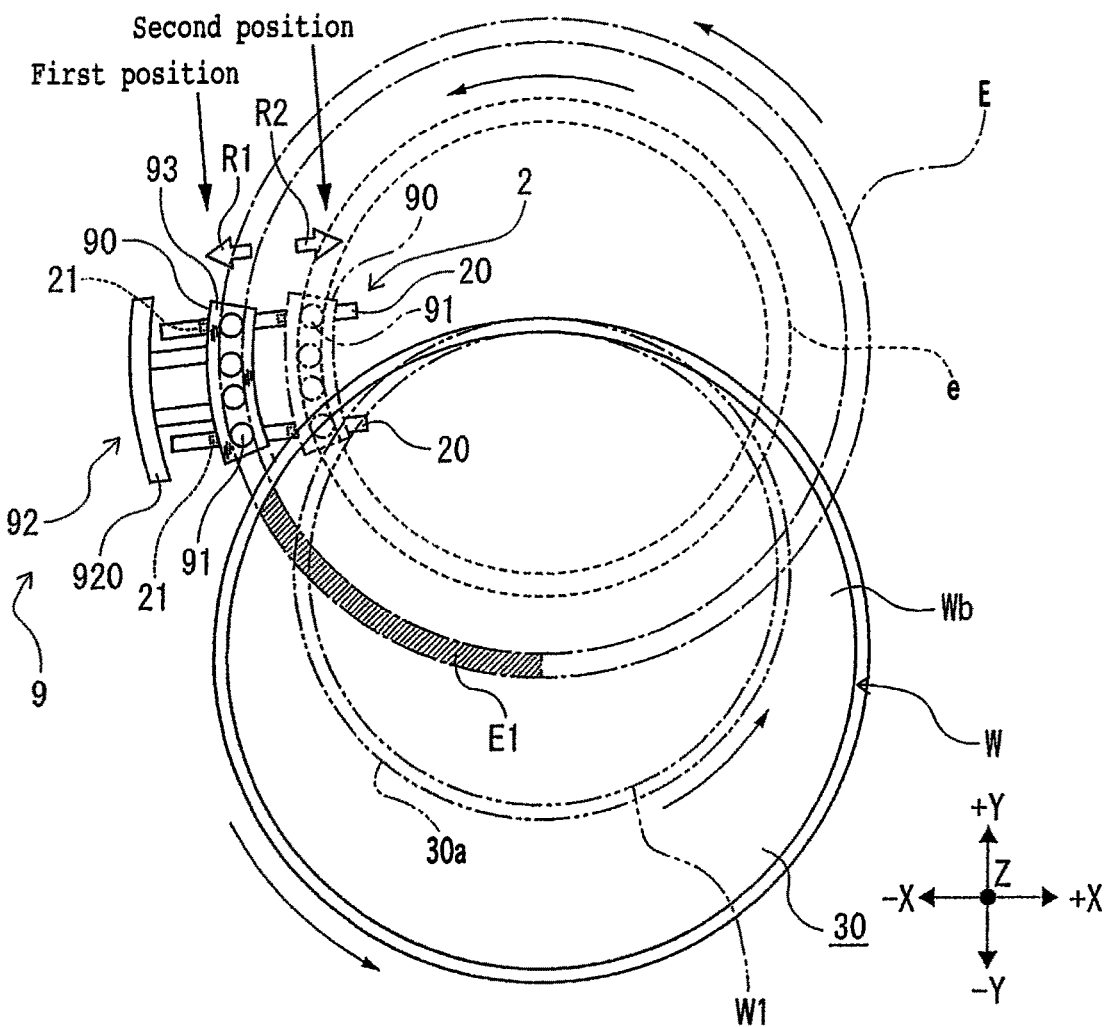
FIG. 7A is an illustration, as viewed from above, of positional relation of a rotational trajectory of a grinding wheel, a processing region of processing of the workpiece by the grindstone, and the light applying unit during grinding.
Figure 7B:
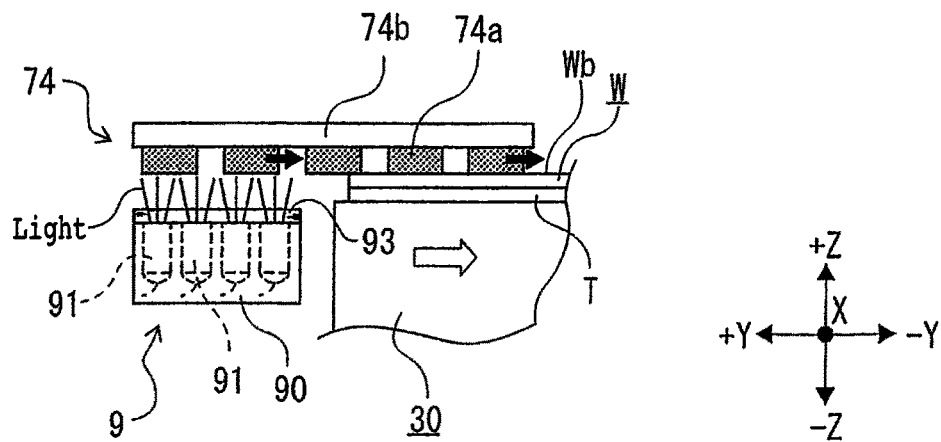
FIG. 7B is an illustration, as viewed from a lateral side, of a state in which the grindstone immediately after application of light to a grinding surface is cutting into the workpiece.

For example, in a state in which the aligning of the grinding wheel 74 and the holding table 30 has been conducted, the light applying unit 9 disposed adjacent to the holding table 30 is disposed on the immediately upstream side of a position at which the grindstones 74a enter the processing region E1, as depicted in FIG. 7A. In addition, in the present embodiment, since the grinding wheel 74 mounted to the spindle 70 has the first diameter (8 inches), the light applying unit 9 is positioned at the first position on the rotational trajectory E of the grinding wheel 74. The first position is, for example, such a position that the light emission sections 91 of the light applying unit 9 are positioned beneath the grinding surfaces of the grindstones 74a. The knob 213a of the position fixing mechanism 21 depicted in FIG. 5 is pulled downward against the compression coil spring 212, and the projection 211a is disengaged from the positioning recessed grooves 201 of the guide rails 20, resulting in a state in which the position fixing mechanism 21 and the light applying unit 9 to which the position fixing mechanism 21 is fixed are movable along the guide rails 20. Note that the positioning recessed grooves 201 are recessed grooves which are used at the time of positioning the light applying unit 9 at the second position on the rotational trajectory e of the grinding wheel in the case where the grinding wheel has the second diameter (6 inches). The second position is, for example, such a position that the light emission sections 91 of the light applying unit 9 are positioned beneath the grinding surfaces of the grindstones of the 6-inch grinding wheel.

When the position fixing mechanism 21 is moved in the direction of arrow R1 toward the positioning recessed grooves 200 which are used at the time of positioning the light applying unit 9 at the first position on the rotational trajectory E of the grinding wheel 74, the projection 211a is fitted into the positioning recessed grooves 200 of the guide rails 20 by the biasing force of the compression coil spring 212, and the light applying unit 9 can be fixed on the guide rails 20 in a state in which the light applying unit 9 is positioned at the first position on the rotational trajectory E of the grinding wheel 74. Note that since the projection 211a of the movable member 211 is in contact with the lower surfaces of the guide rails 20 during movement of the position fixing mechanism 21, a released state of the position fixing mechanism 21 is maintained even if the knob 213a is not kept pulled downward during the movement, and, when the projection 211a reaches a position beneath the positioning recessed grooves 200, it is automatically fitted into the positioning recessed grooves 200 by the biasing force of the compression coil spring 212, and the position fixing mechanism 21 is also put into a fixation state.

Attendant on the start of grinding, the light emission sections 91 of the light applying unit 9 positioned at the first position are put into an ON state, and the light emission sections 91 emit light (UV light) of a wavelength of approximately 365 nm, for example. Then, this light is applied to the grinding surfaces of the grindstones 74a of the grinding wheel 74 being rotated, from directly below.

By the application of the light, the photocatalyst grains P2 mixedly present in the grindstones 74a are excited, that is, electrons in a valence band of the photocatalyst grains P2 are excited, whereby two kinds of carriers, namely, electrons and holes, are generated. The holes generated in the photocatalyst grains P2 mixedly present in the grindstones 74a oxidize the grinding water coming into contact with the surfaces of the photocatalyst grains P2, thereby producing hydroxyl radicals having a high oxidizing power. Therefore, the grinding water having contacted the grinding surfaces of the grindstones 74a is given the oxidizing power due to the hydroxyl radicals on at least the back surface Wb of the workpiece W.

Since the workpiece W formed of SiC is embrittled through oxidation by the hydroxyl radicals thus produced, it becomes easy to grind the workpiece W by the grinding wheel 74. In addition, the time of presence of the hydroxyl radicals thus produced is very short, and, therefore, other oxidation than that of the back surface Wb of the workpiece W by the grinding water is not generated. In addition, the jetted grinding water functions also to cool the part of contact between the grindstones 74a and the back surface Wb of the workpiece W and to remove grinding swarf generated at the back surface Wb of the workpiece W.

Note that even where, for example, the workpiece W is a wafer formed of a metal or a wafer in which metallic electrodes are partly exposed to the back surface side of the wafer, grinding can be performed while embrittling the metal through oxidation by the strong oxidizing power of the hydroxyl radicals, so that smooth grinding of the workpiece can be achieved.

In addition, the grinding surfaces of the grindstones 74a formed using the vitrified bond B1 as a bonding agent are enhanced in hydrophilicity through, for example, formation of highly polar hydrophilic groups by application of light, so that the grinding water becomes less liable to form droplets on the grinding surfaces of the grindstones 74a, and the grinding water becomes liable to spread in a wafer film form over the whole grinding surfaces of the grindstones 74a. Therefore, the grindstones 74a thus made hydrophilic enter the processing region E1 while being accompanied by much grinding water, and grind the back surface Wb of the workpiece W. With more grinding water entering the area of contact between the back surface Wb of the workpiece W and the grinding surfaces of the grindstones 74a, generation of frictional heat in the area of contact is restrained. Consequently, excessive wear of the grindstones 74a can be restrained, and a swarf discharging property can be enhanced. Further, with the grindstones 74a made hydrophilic, the grinding water is effectively supplied into the processing region E1 where the grindstones 74a grind the workpiece W, and, accordingly, processing quality can be prevented from being lowered due to processing heat.

Note that in the case where the grindstone 74a does not contain the photocatalyst grains P2, the light emission sections 91 may apply, for example, UV light of a wavelength of 185 nm and UV light of a wavelength of 254 nm toward the grindstones 74a. With the UV light of the wavelength of 185 nm applied to the grinding surfaces of the grindstones 74a, oxygen molecules in air present between the lower surfaces of the grindstones 74a and the light emission sections 91 absorb the UV light, whereby oxygen atoms in a ground state are produced. The oxygen atoms thus produced combine with oxygen molecules in the surroundings, to produce ozone. Further, ozone thus produced absorbs the UV light of the wavelength of 254 nm, whereby active oxygen in an excited state is produced. Since active oxygen and ozone have a high oxidizing power, they combine with carbon, hydrogen or the like generated at the grinding surfaces of the grindstones 74a, to gradually produce highly polar hydrophilic groups on the grinding surfaces of the grindstones 74a, resulting in that the grindstones 74 are made to be hydrophilic.

Figure 8:
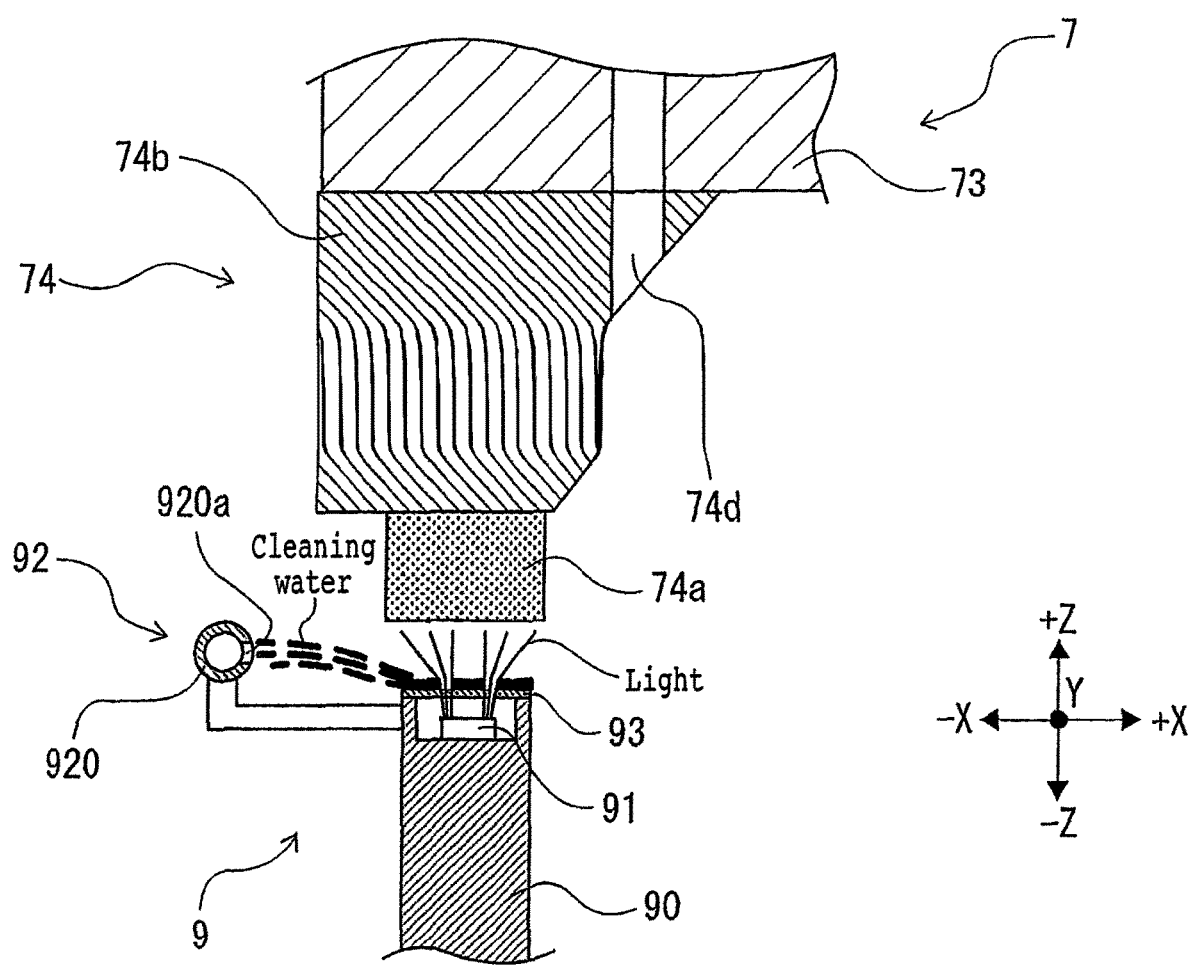
FIG. 8 is an end view partly depicting a state in which cleaning water is supplied toward a cover over a light emission section during grinding.

In addition, as depicted in FIG. 8, during grinding, the cleaning water supply section 92 supplies cleaning water to the cover 93 over the light emission sections 91. Specifically, the cleaning water jetted from the cleaning water nozzle 920 onto the cover 93, whose flow is appropriately straightened, gradually remove dirt such as grinding swarf deposited on the cover 93, whereby the light generated by the light emission sections 91 during grinding can always be appropriately applied to the processing surfaces of the grindstones 74a.

According to an example of experimental results obtained with respect to grinding, grinding of a workpiece W formed of SiC by 50 μm by use of a conventional grinding apparatus took 110 seconds, whereas the grinding by use of the grinding apparatus 1 according to the present invention took only 90 seconds, so that a shortening of grinding time could be realized. In addition, in grinding of a Si surface of a workpiece W, 83% of the whole part of the grindstones of a conventional grinding apparatus was worn where the grinding amount was 100, whereas the wear of the grindstones 74a of the grinding apparatus 1 according to the present invention was only 57% of the whole part where the grinding amount was 100. Further, in grinding of a C surface of a workpiece W, 60% of the whole part of the grindstones of a conventional grinding apparatus was worn where the grinding amount was 100, whereas the wear of the grindstones 74a of the grinding apparatus 1 according to the present invention was only 39% of the whole part where the grinding amount was 100.

Note that the grinding apparatus 1 according to the present invention is not limited to that in the present embodiment, and the configuration of the grinding apparatus 1 illustrated in the attached drawings and the like are not limitative, and modifications can be appropriately made within such ranges that the effect of the present invention can be produced.

For example, in the case of grinding a workpiece W1 of 6 inches in diameter in the grinding apparatus 1, the 8-inch holding table 30 is replaced with a 6-inch holding table 30a, and the grinding wheel 74 of 8 inches in diameter is replaced with a grinding wheel of 6 inches in diameter. Further, in a state in which aligning of the 6-inch grinding wheel and the 6-inch holding table 30a has been conducted during the grinding, the light applying unit 9 is positioned at the second position on the rotational trajectory e of the 6-inch grinding wheel indicated by dotted line in FIG. 7A. Specifically, the projection 211a is disengaged from the positioning recessed grooves 200 of the guide rails 20, resulting in a state in which the light applying unit 9 is movable along the guide rails 20. Then, the position fixing mechanism 21 is moved in the direction of arrow R2 toward the positioning recessed grooves 201, and the projection 211a is fitted into the positioning recessed grooves 201 of the guide rails 20, whereby the light applying unit 9 is fixed on the guide rails 20 in a state in which the light applying unit 9 is positioned at the second position on the rotational trajectory e of the grindstones of the 6-inch grinding wheel. In this state, grinding of the 6-inch workpiece W1 is conducted while light of a predetermined wavelength is being applied from the light applying unit 9 to the grinding surfaces of the grindstones 74a.

The structure of the position fixing mechanism 21 of the light applying unit moving section 2 is not limited to the example in the present embodiment, and the part at which to dispose the position fixing mechanism 21 is not limited to the side surface of the base section 90 of the light applying unit 9. In addition, for example, a positioning recessed groove other than the positioning recessed groove 200 and the positioning recessed groove 201 may be formed at a predetermined position deviated from the positioning recessed groove 201 in the lower surfaces of the guide rails 20 further by 2 inches toward the arrow R2 direction side, such that the light applying unit 9 can be positioned at a third position on a rotational trajectory of a 4-inch grinding wheel in the case of grinding a workpiece of 4 inches in diameter.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A grinding apparatus comprising:

a holding table that holds a workpiece; and a grinding unit including a spindle and a grinding wheel that is mounted to the spindle and that grinds the workpiece held by the holding table, wherein the grinding wheel has a grindstone formed by binding abrasive grains with a bonding agent, and the grinding apparatus further comprises:

a grinding water supply unit that supplies grinding water to at least the grindstone when the workpiece held by the holding table is ground by the grinding unit;

a light applying unit that is disposed adjacent to the holding table and that applies light to a grinding surface of the grindstone grinding the workpiece held by the holding table; and a light applying unit moving section by which the light applying unit can be positioned at a first position on a first rotational trajectory of the grinding wheel mounted on the spindle in the case where the grinding wheel has a first diameter and a second position on a second rotational trajectory of the grinding wheel in the case where the grinding wheel has a second diameter.

2. The grinding apparatus according to claim 1, wherein the grindstone has the abrasive grains and photocatalyst grains bound by the bonding agent, and the light applying unit applies the light that excites the photocatalyst grains.

3. The grinding apparatus according to claim 1, wherein the bonding agent is a vitrified bond.

4. The grinding apparatus according to claim 2, wherein the bonding agent is a vitrified bond.

* * * * *